US009590159B2

(12) United States Patent
Gao et al.

(10) Patent No.: US 9,590,159 B2
(45) Date of Patent: Mar. 7, 2017

(54) THERMOELECTRIC POWER GENERATION FROM POWER FEEDER

(75) Inventors: Lijun Gao, Renton, WA (US); Shengyi Liu, Sammamish, WA (US); John M. Fifield, Kent, WA (US)

(73) Assignee: THE BOEING COMPANY, Chicago, IL (US)

( * ) Notice: Subject to any disclaimer, the term of this patent is extended or adjusted under 35 U.S.C. 154(b) by 794 days.

(21) Appl. No.: 13/190,347

(22) Filed: Jul. 25, 2011

(65) Prior Publication Data
US 2013/0025644 A1 Jan. 31, 2013

(51) Int. Cl.
*H01L 35/28* (2006.01)
*H01L 35/30* (2006.01)
*B64G 1/42* (2006.01)
*B64D 41/00* (2006.01)

(52) U.S. Cl.
CPC .............. *H01L 35/30* (2013.01); *B64G 1/421* (2013.01); *B64G 1/428* (2013.01); *B64D 41/00* (2013.01); *B64D 2221/00* (2013.01)

(58) Field of Classification Search
CPC ......... H01L 35/30; B64G 1/428; B64G 1/421; B64D 41/00; B64D 2221/00
USPC ................................................ 136/201, 208
See application file for complete search history.

(56) References Cited

U.S. PATENT DOCUMENTS

| | | |
|---|---|---|
| 3,269,872 A | 8/1966 | Thompson |
| 3,800,062 A | 3/1974 | Kataoka et al. |
| 5,466,974 A * | 11/1995 | Sutrina ............... H02B 1/04 307/38 |
| 6,028,263 A * | 2/2000 | Kobayashi et al. ........... 136/201 |
| 6,096,966 A * | 8/2000 | Nishimoto et al. .......... 136/205 |
| 7,498,698 B2 * | 3/2009 | Yamaguchi ................... 307/147 |
| 7,626,114 B2 | 12/2009 | Stark |
| 7,638,705 B2 | 12/2009 | Venkatasubramanian |
| 7,649,138 B2 * | 1/2010 | Hiller et al. ................... 136/205 |

(Continued)

FOREIGN PATENT DOCUMENTS

| | | |
|---|---|---|
| JP | 5568006 A | 5/1980 |
| JP | H3-66182 A | 3/1991 |

(Continued)

OTHER PUBLICATIONS

Nagayoshi, H. et al., Evaluation of Multi MPPT Thermoelectric Generator System, 2008, IEEE, 2007 International Conference on Thermoelectrics, pp. 318-321.*
Yadav, A. et al., "Fiber-based flexible thermoelectric power generator", 2007, Journal of Power Sources 175, pp. 909-913.*
Tang et al., Dynamic Rating of Forced Cooled Transmission Cables, IEEE Computer Applications in Power, Jul. 1992, (4 pgs).
Hitchcock et al., The Cooling of Underground EHV Transmission Cables, IEEE Transactions on Power Apparatus and Systems, vol. Pas-87, No. 1, Jan. 1968, (6 pgs).
Extended European Search Report for European Application No. 12174648.1, dated Jul. 15, 2014, 6 pages.

(Continued)

*Primary Examiner* — Tamir Ayad
(74) *Attorney, Agent, or Firm* — Toler Law Group, PC

(57) ABSTRACT

Apparatuses, methods, and systems are disclosed to use thermoelectric generating (TEG) devices to generate electricity from heat generated by a power cable. An apparatus includes multiple thermoelectric generating (TEG) devices. Each of the TEG devices has a first surface configured to be positioned in thermal communication with an outer surface of the power cable and a second surface configured to be positioned proximate to an ambient environment around the power cable. The apparatus also includes a set of terminals electrically coupled to the TEG devices. When a temperature differential exists between the first surface and the second surface, the TEG devices convert heat into electricity presented at the set of terminals.

19 Claims, 5 Drawing Sheets

(56) References Cited

U.S. PATENT DOCUMENTS

| | | | |
|---|---|---|---|
| 7,765,811 B2* | 8/2010 | Hershberger | F25B 21/02 |
| | | | 136/203 |
| 2010/0132818 A1* | 6/2010 | Dell et al. | 137/551 |

FOREIGN PATENT DOCUMENTS

| | | |
|---|---|---|
| JP | 2000-35825 A | 2/2000 |
| JP | 2002-199739 A | 7/2002 |
| JP | 2003-32865 A | 1/2003 |
| JP | 2003032865 A | 1/2003 |
| JP | 2008-167626 A | 7/2008 |
| JP | 2008167626 A | 7/2008 |
| JP | 2009-218015 A | 9/2009 |
| WO | 2005098225 A1 | 10/2005 |

OTHER PUBLICATIONS

Chen, L. et al., "Modeling and Power Conditioning for Thermo-electric Generation," IEEE Power Electronics Specialists Conference, 2008, Piscataway, NJ, pp. 1098-1103.

First Office Action for Chinese Application No. 201210260728.9; dated Sep. 6, 2015; 11 pages.

"Frequently Asked Questions About Our Power Generation Technology", Tellurex, http://www.tellurex.com/technology/seebeck-faq.php; retrieved on Aug. 12, 2013; (9 pages).

Notice of Reasons for Rejection, Japanese Patent Application No. 2012-164284; Date Issued: May 10, 2016; Japan Patent Office—Second Examination Department: Dynamo-Electronic Machines and Control Division.

\* cited by examiner

THERMOELECTRIC POWER GENERATION FROM POWER FEEDER

FIELD OF THE DISCLOSURE

The present disclosure is generally related to thermoelectric power generation.

BACKGROUND

Power feeders in power distribution systems may generate significant heat due to ohmic heating. The heat generated may be undesirable. For example, resistivity of the power feeder may increase with temperature, making the power feeder's operation less efficient as the power feeder's temperature increases. The heat generated may also have negative effects on other equipment or structures. When the power system is installed in an enclosed space, a cooling system may be provided to remove the heat generated by the power feeder. Operating the cooling system may consume power, which may reduce overall energy efficiency of a system that uses the power feeder.

SUMMARY

Apparatuses, methods, and systems are disclosed that use thermoelectric generating (TEG) devices to generate electricity from heat generated by a power cable. The TEG devices may be positioned proximate to an outer surface of the power cable. A temperature differential between the power cable and the ambient environment causes the TEG devices to generate electricity (e.g., via the Seebeck effect). The TEG devices convert heat into electricity, which results in some cooling of the power cable.

The power cable may pass through multiple zones that have different ambient environments and different ambient temperatures. The temperature differentials between the power feeder cable and the different ambient temperatures may be different in different zones. An output voltage level of a TEG device may be related to the temperature differential across the TEG device. Accordingly, TEG devices in different zones may output electricity at different voltage levels. Coupling TEG devices generating electricity at different voltage levels to a common bus may result in some loss of power. Embodiments of the present disclosure monitor voltage and current of electricity generated by different TEG devices or groups of TEG devices, and may control power converters coupled to the TEG devices to operate each TEG device or group of TEG devices at their maximum power points and to convert electricity received from the TEG devices to a common voltage.

In a particular embodiment, an apparatus includes multiple thermoelectric generating (TEG) devices. Each of the TEG devices has a first surface configured to be positioned in thermal communication with an outer surface of a power cable and a second surface configured to be positioned proximate to an ambient environment around the power cable (e.g., closer to the ambient environment than to the power cable). The apparatus also includes a set of terminals electrically coupled to the TEG devices. When a temperature differential exists between the first surface and the second surface, the TEG device converts heat into electricity presented at the set of terminals.

In another particular embodiment, a method includes receiving first electrical power from a first thermoelectric generating (TEG) device in thermal communication with a first portion of a power cable and in thermal communication with a first ambient environment through which the first portion of the power cable passes. Current passing through the first portion of the power cable may result in a first temperature differential between the first portion of the power cable and the first ambient environment. The first electrical power is generated at a first voltage that may be controlled by a first maximum power point tracking device. The method also includes receiving second electrical power from a second TEG device in thermal communication with a second portion of the power cable and in thermal communication with a second ambient environment through which the second portion of the power cable passes. Current passing through the second portion of the power cable may result in a second temperature differential between the second portion of the power cable and the second ambient environment. The second electrical power is generated at a second voltage that may be controlled by a second maximum power point tracking device. The method also includes adjusting the first voltage and the second voltage to a third voltage.

In still another particular embodiment, a system includes a power feeder cable configured to convey electrical power generated by an electrical power generating system through two or more zones. The power feeder cable may be exposed to a different ambient environment in each of the two or more zones. The system may also include a first thermoelectric generating (TEG) device positioned along a surface of the power feeder cable in a first zone of the two or more zones. The first TEG device is configured to generate electrical power based on a first temperature differential between the power feeder cable and a first ambient temperature in the first zone. The system may also include a first maximum power point tracking device that controls a first operating voltage of the first TEG device to be near or at a maximum power point voltage of the first TEG device at the first temperature differential. The system may also include a second TEG device positioned along the surface of the power feeder cable in a second zone of the two or more zones. The second TEG device is configured to generate electrical power based on a second temperature differential between the power feeder cable and a second ambient temperature in the second zone. The system may further include a second maximum power point tracking device that controls a second operating voltage of the second TEG device to be near or at a maximum power point voltage of the second TEG at the second temperature differential. The system may also include a first power conversion device that converts the first operating voltage to a third voltage and a second power conversion device that converts the second operating voltage to the third voltage.

The features, functions, and advantages that are described can be achieved independently in various embodiments or may be combined in yet other embodiments, further details of which are disclosed with reference to the following description and drawings.

DETAILED DESCRIPTION

Figure 1:
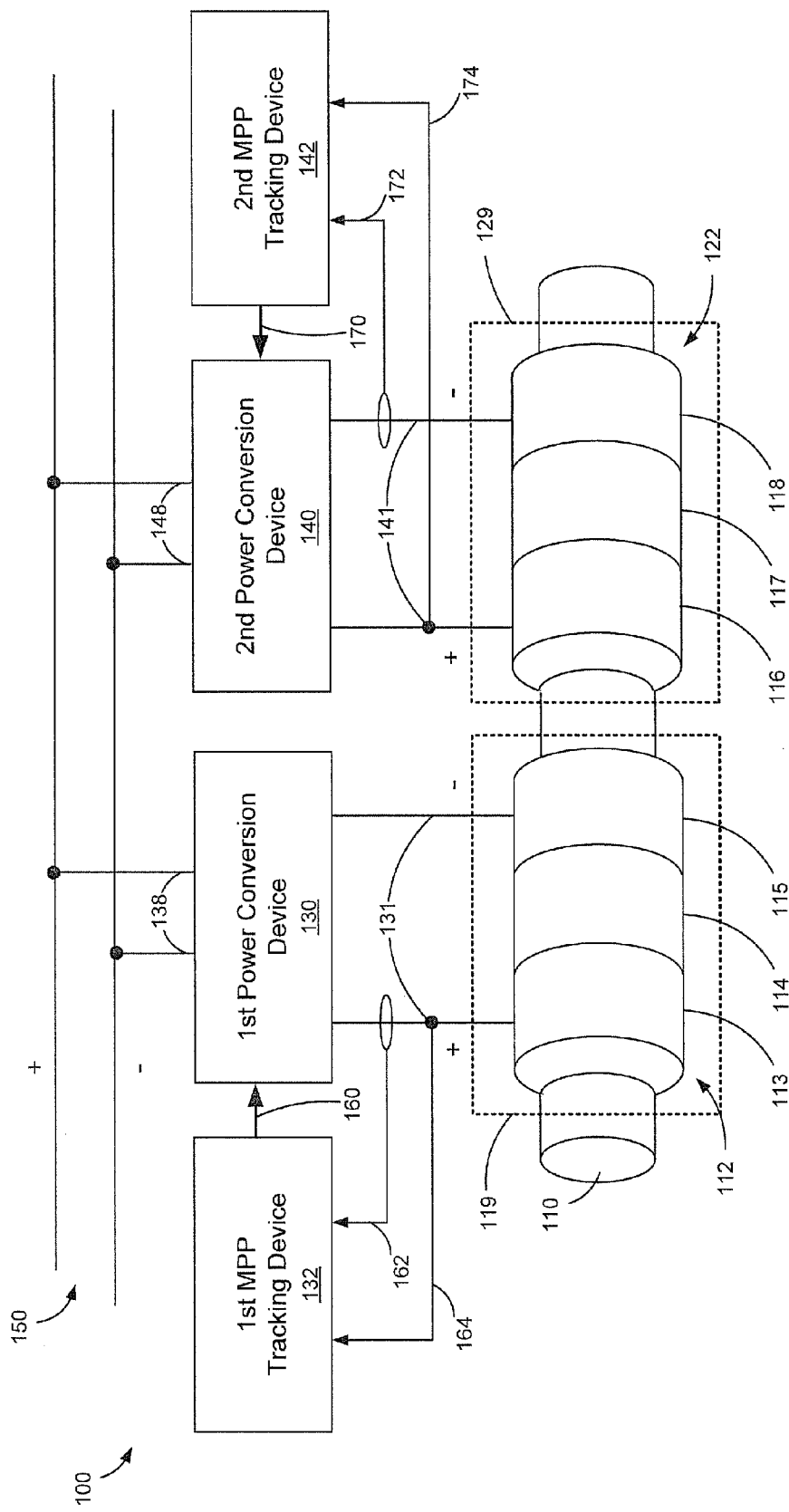
FIG. 1 is a diagram of a particular embodiment of thermoelectric generating (TEG) devices positioned around a power cable.

FIG. 1 is a diagram of a system 100 including thermoelectric generating (TEG) devices 113-118 positioned proximate a power cable 110. Each of the TEG devices 113-118 may include multiple positive-type doped to negative-type doped (P-N) thermoelectric pellet pairs. The multiple P-N thermoelectric pellet pairs may be housed within a jacket (not shown in FIG. 1) to form one of the TEG devices 113-118.

The power cable 110 may pass through different ambient environments, such as a first ambient environment 119 and a second ambient environment 129. For example, the power cable 110 may convey electrical power from an electrical power source (e.g., a generation system) to different loads within a structure. In this example, the different ambient environments may correspond to two or more zones of the structure that are exposed to different environmental conditions. Each of the ambient environments may have a different ambient temperature. The temperature of the power cable 110 may be nearly constant through each of the ambient environments 119, 129 and may be different in each of the ambient environments.

A first set 112 of TEG devices, including the TEG devices 113-115, may be associated with (e.g., located within) the first ambient environment 119 and a second set 122 of the TEG devices, including the TEG devices 116-118, may be associated with (e.g., located within) the second ambient environment 129. Each of the sets 112, 122 of TEG devices may generate electricity based on a temperature differential between the power cable 110 and the ambient environment 119, 129 with which the set of TEG devices is associated. Since the temperature differential experienced by each of the sets 112, 122 of TEG devices may be different, characteristics of the electricity generated by each of the sets 112, 122 of TEG devices may be different. For example, the TEG devices 113-118 may generate electricity at different voltage levels in response to different temperature differentials.

The TEG devices 113-115 of the first set 112 of TEG devices may be electrically interconnected (in parallel, in series or in an array configuration) to one another and to first terminals 131. The first set 112 of TEG devices may be coupled to a first power conversion device 130 via the first terminals 131. The first power conversion device 130 may receive electricity from the TEG devices 113-115 of the first set 112 of TEG devices via the first terminals 131 and may process (e.g., transform or otherwise convert) the electricity before supplying the electricity to a bus 150 via third terminals 138.

A first maximum power point (MPP) tracking device 132 may control the first power conversion device 130 via a first control input 160. The MPP tracking device 132 may cause the first power conversion device 130 to operate the first set 112 of TEG devices to at a first operating voltage that is at or near a MPP voltage of the first set 112 of TEG devices at the first temperature differential. The MPP tracking device 132 may determine a maximum power point of the first set 112 of TEG devices (as described with reference to FIG. 4) at the first temperature differential. For example, the first MPP tracking device 132 may implement a MPP tracking process, such as a perturb-and-observe process. In another example, the MPP tracking device 132 may determine the MPP of the first set 112 of TEG devices based on a known relationship between an output current or voltage of the first set 112 of MPP devices and power output by the first set 112 of TEG devices. The MPP tracking device 132 may sense voltage output of the terminals 131 via a sensing line 164 and may sense current output of the terminals 131 via a sensing line 162. In a particular embodiment, the first MPP tracking device 132 causes the first power conversion device 130 to adjust an effective resistance applied to the terminals 131 to cause the first set 112 of TEG devices to generate the electricity at or near an MPP voltage of the first set 112 of TEG devices.

The TEG devices 116-118 of the second set 122 of TEG devices may be electrically interconnected (in parallel, in series, or in an array configuration) to one another and to second terminals 141. The second set 122 of TEG devices may be coupled to a second power conversion device 140 via the second terminals 141. The second power conversion device 140 may receive electricity from the TEG devices 116-118 of the second set 122 of TEG devices via the second terminals 141 and may process the electricity before supplying the electricity to the bus 150 via fourth terminals 148.

A second MPP tracking device 142 may control the second power conversion device 140 via a second control input 170. The second MPP tracking device 142 may cause the second power conversion device 140 to operate the second set 122 of TEG devices at a second operating voltage that is at or near a MPP voltage of the second set 112 of TEG devices at the second temperature differential. The second MPP tracking device 142 may determine a maximum power point voltage of the second set 122 of TEG devices (as described with reference to FIG. 4) at the second temperature differential. The maximum power point voltage of the second set 122 of TEG devices may be different from the maximum power point voltage of the first set 112 of TEG devices due to differences in design or construction of the TEG devices 113-155 relative to the TEG devices 116-118, due to differences between the first temperature differential and the second temperature differential, or both.

The second MPP tracking device 142 may implement a MPP tracking process, such as a perturb-and-observe process or may determine the MPP of the second set 122 of TEG devices based on a known relationship between an output current or voltage of the second set 122 of MPP devices and power output by the second set 122 of TEG devices. The second MPP tracking device 142 may sense voltage output of the terminals 141 via a sensing line 174 and may sense current output of the terminals 141 via a sensing line 172. The MPP tracking devices 132, 142 may control the operating voltages of the different sets 112, 122 of TEG devices independently. Thus, power provided to the power conversion devices 130 and 140 may be at different voltage levels.

In a particular embodiment, the power conversion devices 130, 140 may implement a power conversion operation to match the voltages provided to the bus 150 while enabling each of the sets 112, 122 of TEG devices to operate independently at or near its MPP voltage. For example, the first power conversion device 130 may convert the electricity received from the first set 112 of TEG devices to be at a substantially equal voltage level to the second operating voltage of the second set 122 of TEG devices. In another example, the first power conversion device 130 may convert electricity received from the first set 112 of TEG devices to a common bus voltage level and the second power conversion device 140 may also convert electricity received from the second set 122 of TEG devices to the common bus voltage level. In an illustrative example, the bus 150 may operate at a fixed voltage and the power conversion devices 130, 140 may receive electricity generated by the TEG devices 113-118 and output electricity at the fixed voltage of the bus 150.

Figure 2:
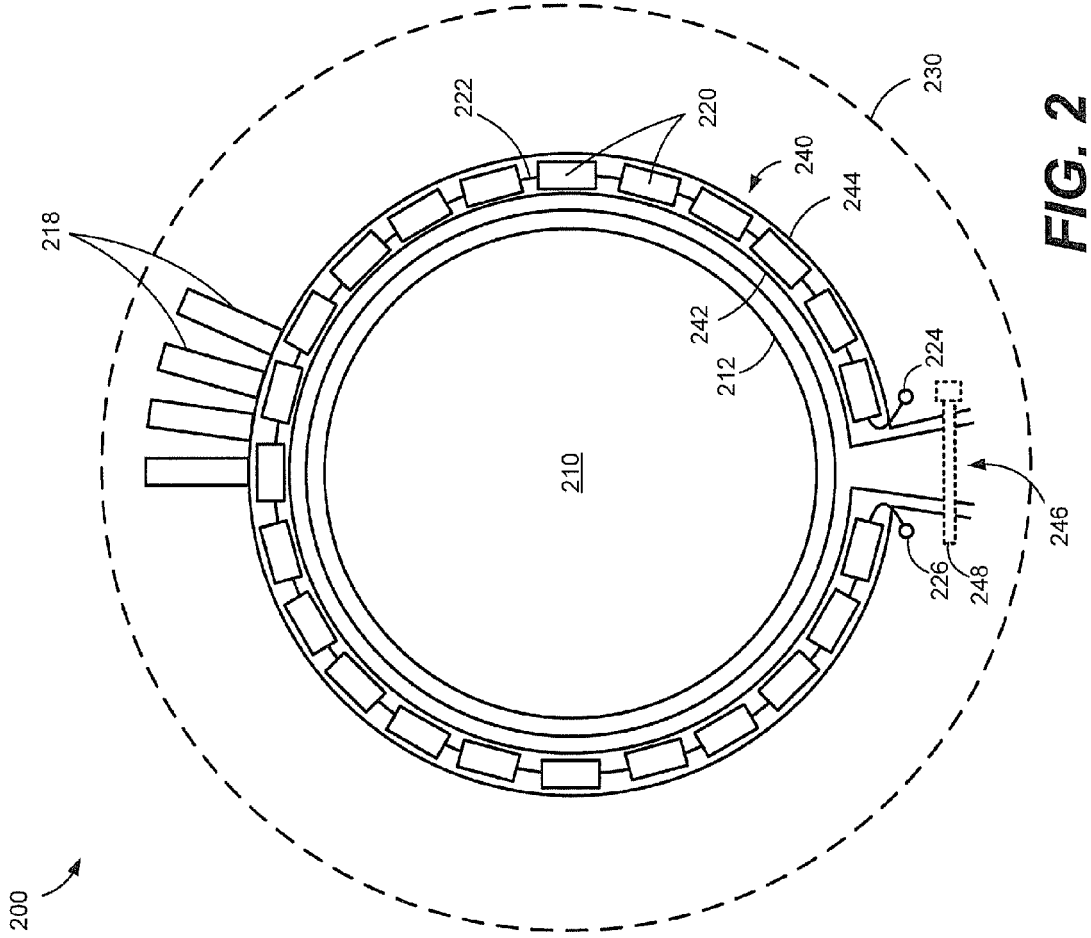
FIG. 2 is a cross-sectional view of a power cable having a plurality of TEG devices positioned between an outer surface of the cable and an ambient environment.

FIG. 2 is a cross-sectional view of a particular embodiment of a system 200 that includes a power cable 210 and multiple thermoelectric generating (TEG) devices 220 between the power cable 210 and an ambient environment 230. The system 200 may be a cross-section of a portion of the system 100 of FIG. 1. Each of the TEG devices 220 may include one or more positive-type doped to negative-type doped (P-N) thermoelectric pellet pairs that are configured to convert heat into electricity. Each of the TEG devices 220 may have a first surface configured to be positioned in thermal communication with an outer surface 212 of the power cable 210 and a second surface configured to be positioned proximate to the ambient environment 230 (i.e., closer to the ambient environment 230 than to the power cable 210). A temperature differential may exist between the power cable 210 and the ambient environment 230. For example, the power cable 210 may be hotter than the ambient environment due to ohmic (i.e., resistive) heating of the power cable 210 as a result of a current in the power cable 210. The TEG devices 220 may be driven by the temperature differential to convert heat into electricity.

The TEG devices 220 may be positioned in a sleeve or another containing device, such as a jacket 240. The jacket 240 may have an inner surface 242 and an outer surface 244. The jacket 240 may be deformable to enable the TEG devices 220 to be substantially conformed to the outer surface 212 of the power cable 210. For example, the jacket 240 may be configured as a power cable wrap that can be wrapped around the power cable 210 to secure the TEG devices 220 proximate the power cable 210. Additionally, an inner surface of each of the TEG devices 220 may be shaped to substantially conform to the outer surface 212 of the power cable 210. For example, when the power cable 210 has a round cross-section, as illustrated in FIG. 2, the inner surface of each of the TEG devices 220 may be curved to conform to the outer surface 212 of the power cable 210. Similarly, when the power cable 210 is flat (e.g., such as a bus bar), the inner surface of each of the TEG devices 220 may be flat to conform to the outer surface 212 of the power cable 210.

The jacket 240 may include an opening 246 to facilitate wrapping the jacket 240 around the power cable 210. Once installed around a portion of the power cable 210, the jacket 240 may be secured to the power cable 210 using one or more fasteners 248. Thus, the TEG devices 220 can be installed on various portions of the power cable 210, such as portions of the power cable 210 that extend through different ambient environments.

In a particular embodiment, the inner surface 242 of the jacket 240, the outer surface 244 of the jacket 240, or both, may be formed of a thermally-conductive material to facilitate heat transfer. In this embodiment, the thermally-conductive inner surface 242 and the thermally-conductive outer surface 244 transfer the temperature differential between the outer surface 212 of the power cable 210 and the ambient environment 230 to the TEG devices 220 to facilitate generation of electrical power. The inner surface 242 of the jacket 240, the outer surface 212 of the power cable 210, or both, may include an electrically-insulating material. In a particular embodiment, the outer surface 244 of the jacket 240 may include or may be coupled to heat sink projections 218 or other projections to increase an effective surface area of the outer surface 244 of the jacket 240. The heat sink projections 218 may improve heat transfer between the outer surface 244 of the jacket 240 and the ambient environment 230. For example, the increased effective surface area may enable the outer surface 244 of the jacket 240 to achieve a lower temperature, increasing the temperature differential across the TEG devices 220.

The TEG devices 220 along each section of the power cable 210 may be electrically connected. For example, the TEG devices 220 may be electrically connect to one another in series, in parallel, or in an array (e.g., some of the TEG devices 220 connected together in series to form a chain, with separate chains connected to one another in parallel). Electricity from the TEG devices 220 may be conducted to a bus (not shown in FIG. 2) via electrical terminals 224 and 226.

Conversion of heat to electricity by the TEG devices 220 may reduce a heat burden of the power cable 210 (i.e., may cool the power cable). Since resistivity of the power cable 210 may increase as the temperature of the power cable 210 increases, reducing the temperature of the power cable 210 may help to reduce the power cable's resistance to the flow of electricity, improving efficiency of the power cable 210. In addition, converting some of the heat to electricity removes heat that may have adverse effects on other components positioned near the power cable 210.

The electrical terminals 224 and 226 may be coupled to a power converter that is controlled by a maximum power point (MPP) tracking device, as described with reference to FIG. 1. For example, a MPP tracking device may be electrically coupled to the TEG devices 220 to sense output current and voltage at the terminals 224, 226. The MPP tracking device may control the power converter to cause the TEG devices 220 to generate voltage and current presented at the terminals 224, 226 near a maximum power point of the TEG devices 220 at the temperature differential. The power converter may be configured to receive the voltage and the current presented at the terminals 224, 226 and to convert the voltage and the current to an output voltage and an output current presented at a converter output. For example, the converter output may be at a common bus voltage. As described with reference to FIG. 1, there may be separate sets of TEG devices deployed around the power cable 210 as the power cable 210 passes through different ambient environments. MPP tracking devices may independently control power converts coupled to the separate sets of TEG devices to enable each of the sets of TEG devices to operate at or near a MPP voltage.

Figure 3:
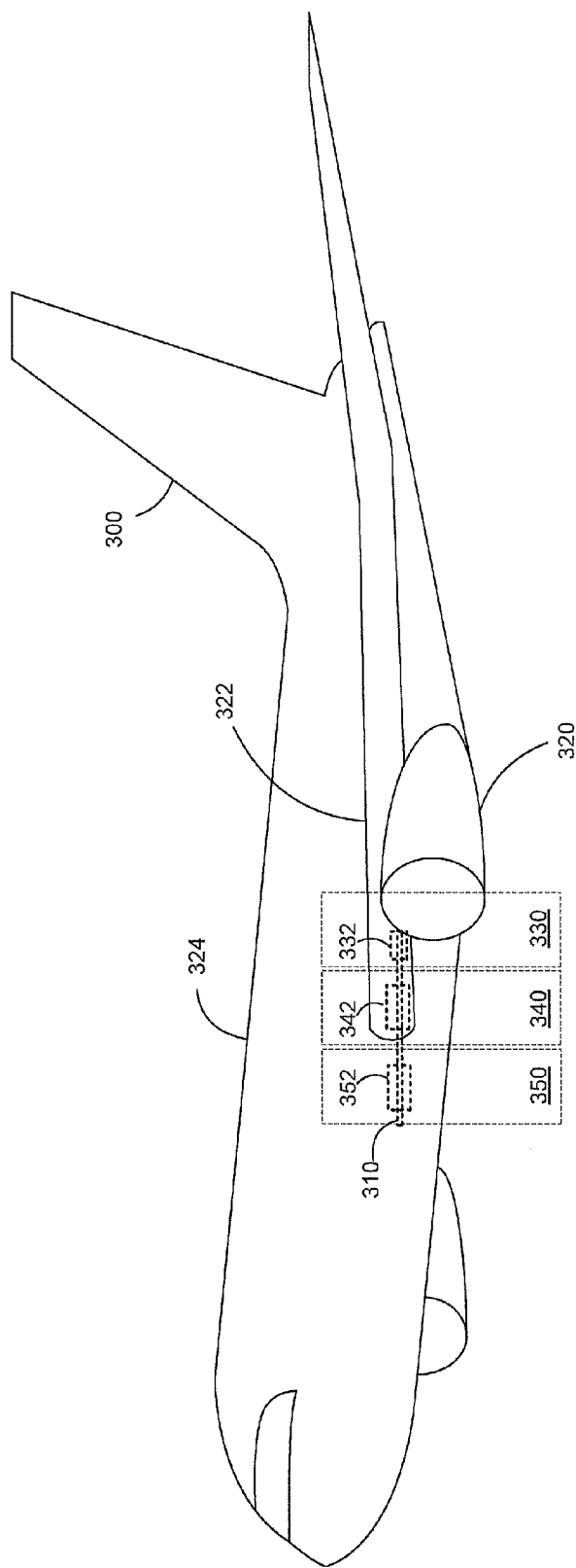
FIG. 3 is a perspective view of a structure having a power cable extending through a plurality of different ambient environments of the structure.

FIG. 3 is a perspective view of a structure having a power cable 310 extending through a plurality of different ambient environments of the structure. For purposes of description and as a particular non-limiting example, the structure is illustrated in FIG. 3 as an aircraft 300; however, the structure may include another type of moveable or non-moveable structure in which power is conveyed between multiple ambient environments via a power cable. For example, the structure may include a watercraft (e.g., a ship or submarine), a spacecraft (e.g., a satellite, a launch vehicle or a space station), a landcraft (e.g., an automobile, a train), or another type of aircraft (e.g., a helicopter). In another example, the structure may be a non-portable structure, such as a building, a bridge, a tower, etc.

In FIG. 3, the power cable 310 (e.g., a power feeder cable) extends from an engine 320 through a wing 322 and into a fuselage 324 of the aircraft 300. The engine 320, in addition to providing thrust for the aircraft 300, may be coupled to a generator to generate electric power that is carried by the power cable 310. Other power generation configurations may also be used. For example, a generator may be driven by a prime mover other than the engine 320, e.g., an auxiliary diesel engine. The embodiment illustrated in FIG. 3 is only one specific example of a path that the power feeder cable 310 may take through a number of distinct ambient environments.

Between the generator and a load or storage device within the fuselage 324, the power cable 310 passes through different ambient environments 330, 340, and 350. The power cable 310 may be located proximate to one or more of the thermoelectric generation (TEG) systems 332, 342, 352 within each of the ambient environments 330, 340, 350. Each of the TEG systems 332, 342, 352 may include one or more TEG devices, such as the TEG devices 113-118 of FIG. 1 or the TEG devices 220 of FIG. 2; one or more maximum power point (MPP) tracking devices, such as the MPP devices 132, 142 of FIG. 1; and one or more power conversion devices, such as the power conversion devices 130, 140 of FIG. 1.

The power cable 310 may maintain a relatively constant temperature within each of the ambient environments 330, 340, 350 due to ohmic heating. However, the ambient environments 330, 340, 350 may have different ambient temperatures. For example, a first ambient environment 330 may be adjacent to or within a housing of the engine 320. Accordingly, the first ambient environment 330 may have a relatively high ambient temperature. As a result, a temperature differential between the power cable 310 and the first ambient environment 330 may be relatively small. A second ambient environment 340 may include a portion of the wing 322. During operation of the aircraft 300 at high altitudes, air outside the wing 322 may be quite cold. Thus, a temperature of the second ambient environment 340 may be relatively cold. As a result, a temperature differential between the power cable 310 and the second ambient environment 340 may be relatively large. A third ambient environment 350 may be within a portion of the fuselage 324 of the aircraft 300, such as in a passenger compartment or luggage compartment. Because the passenger compartment and the luggage compartment may be climate-controlled, the third ambient environment 350 may have a temperature between the temperature of the first ambient environment 330 and the second ambient environment 340. Thus, a temperature differential between the power cable 310 and the third ambient environment 350 may be between the temperature differential of the first ambient environment 330 and the temperature differential of the second ambient environment 340.

TEG devices of the TEG systems 332, 342, 352 may generate electricity having different characteristics based on a temperature differential across the TEG devices. For example, a TEG device of a first TEG system 332 within the first ambient environment 330 may generate electricity with different characteristics than electricity generated by a TEG device of a second TEG system 342 within the second ambient environment 340 due at least in part to the difference in the temperature differentials in the first and second ambient environments 330, 340. Further, each of the TEG devices may have a different maximum power point (MPP) voltage due at least in part to the differences in the temperature differentials.

Each of the TEG systems 332, 342, 352 may include a MPP tracking device to determine a MPP voltage of the TEG system. During operation of the aircraft 300, a temperature of the power cable 310, a temperature of an ambient environment 330, 340, 350, or a combination thereof, may change. The MPP tracking device of each TEG system 332, 342, 352 may control a power conversion device of the TEG system to continuously or occasionally adjust an operating voltage of TEG devices of the TEG system to maintain the operating voltage at or near the MPP voltage of each of the TEG devices. Thus, each of the TEG systems 332, 342, 352 may be controlled independently of the other TEG systems 332, 342, 352 to operate at a MPP. The power conversion device of each of the TEG system 332, 342, 352 may convert power output by the TEG devices of the TEG system to a common voltage, such as a bus voltage.

Figure 4:
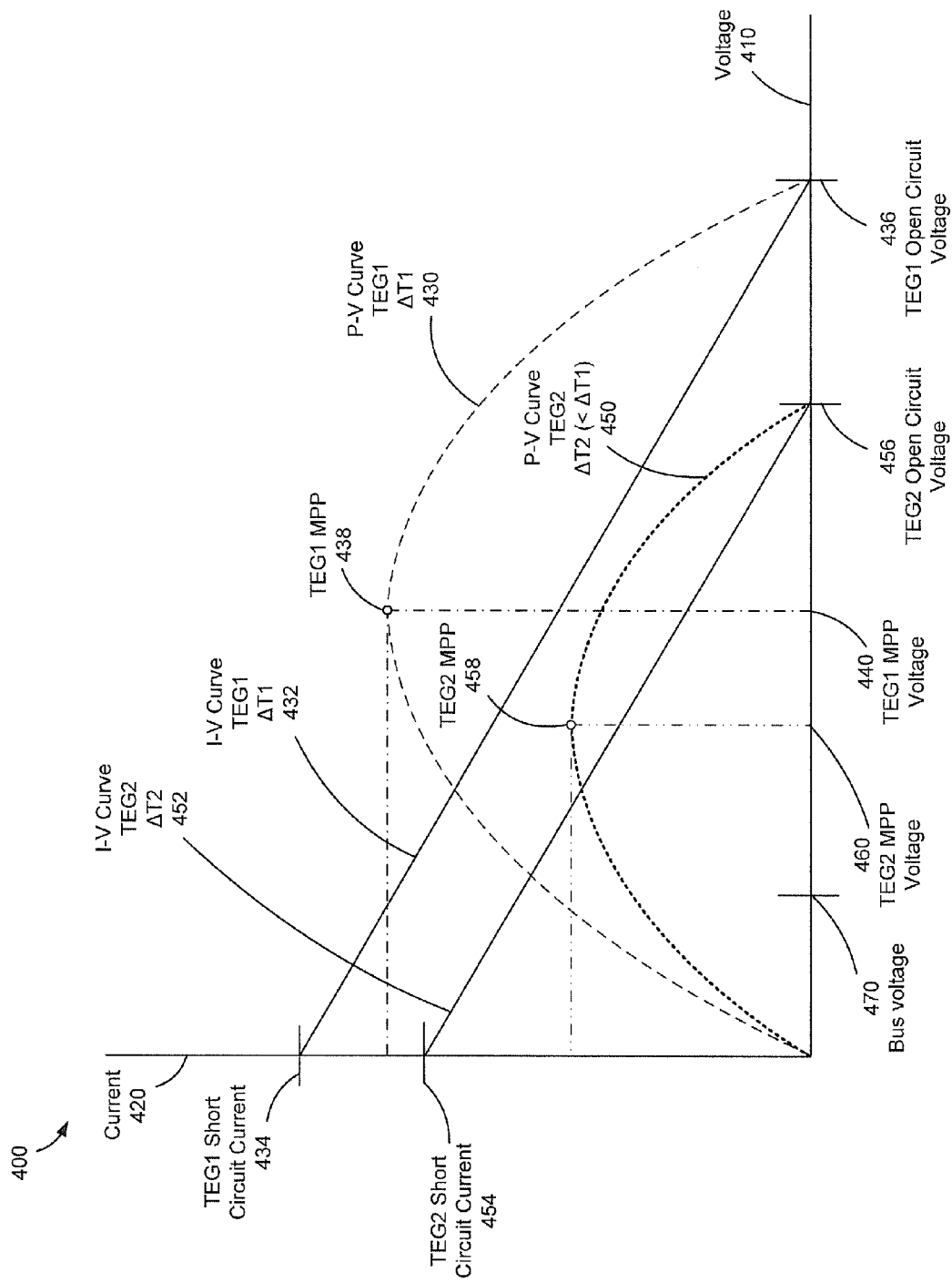
FIG. 4 is a graph of electrical power producing characteristics of two different TEG devices operating at different temperature differentials.

FIG. 4 is a graph 400 of electrical power producing characteristics of thermoelectric generating (TEG) devices. The graph 400 illustrates independent maximum power point tracking for two TEG devices or for a single TEG device at different operating conditions. The graph 400 plots voltage 410 on a horizontal axis and current 420 on a vertical axis.

A first TEG device, TEG1, is operating at a first temperature differential, $\Delta T_1$, and a second TEG device, TEG2, is operating at a second temperature differential, $\Delta T_2$. A power-voltage (P-V) curve 430 represents power output of TEG1, and a P-V curve 450 represents power output of TEG2. The P-V curves 430, 450 indicate that generally more power is generated by TEG1 than is generated by TEG2, which may be a function of characteristics of the TEG devices, a function of differences in the temperature differentials $\Delta T_1$ and $\Delta T_2$, or a combination thereof.

The graph 400 also includes a current-voltage (I-V) curve 432 representing a current-voltage relationship for TEG1 and an I-V curve 452 representing a current-voltage relationship for TEG2. An open circuit voltage 436 and a short circuit current 434 of TEG1 define end points of the I-V curve 432 and the P-V curve 430, and an open circuit voltage 456 and a short circuit current 454 of TEG2 define end points of the I-V curve 452 and the P-V curve 450.

The P-V curves 430 and 450 indicate that maximum power generation for each of the TEG devices is achieved at a different voltage. For example, the P-V curve 430 of TEG 1 has a maximum power point (MPP) 438 that is associated with a MPP voltage 440 of TEG1, and the P-V curve 450 of TEG2 has a MPP 458 that is associated with a MPP voltage 460 of the TEG2. The MPP 438 of TEG 1 and the MPP 458 of TEG2 occur at different MPP voltages 440, 460. Accordingly, operating TEG1 at the MPP voltage 460 of TEG2 may be less efficient than operating TEG1 at the MPP voltage 440 of TEG1, and vice versa.

To improve efficiency of a system that includes multiple TEG devices with different P-V curves, such as the system 100 of FIG. 1, the system 200 of FIG. 2, or the aircraft 300 of FIG. 3, each of the TEG devices may be operated at its corresponding MPP voltage. For example, a first MPP tracking device may control a first power conversion device to operate TEG1 at the MPP voltage 440 of TEG1 and a second MPP tracking device may control a second power conversion device to operate TEG2 at the MPP voltage 460 of TEG2. Electricity generated by the TEG devices may be provided to the power conversion devices, such as the power conversion devices 130, 140 of FIG. 1, to adjust a voltage provided to a power bus, such as the bus 150 of FIG. 1, to a bus voltage 470. Although the bus voltage 470 is illustrated in FIG. 4 as different than the MPP voltages 440, 460 of the TEG devices, in some embodiments or in some circumstances, the bus voltage 470 may be equal to one of the MPP voltages 440, 460. For example, the bus voltage 470 may be specified independently of the MPP voltages, e.g., based on particular design of a system supported by the bus. Thus, the bus voltage 470 may be higher than either or both of the MPP voltages 440, 460, or in some special circumstances, equal to one or both of the MPP voltages 440, 460. Accordingly, each of the TEG devices may operate at peak efficiency (e.g., the MPP) and losses due to supplying power to a bus at mismatched voltages can be minimized.

The graph 400 generally represents the I-V curves 432 and 452 as linear. When the I-V curve of a TEG device is linear, the MPP voltage may occur at 50% of the open circuit voltage. In this situation, the MPP voltage may be selected as one-half of the open circuit voltage of the TEG device under the present operating conditions (e.g., temperature differential). For example, the MPP voltage 438 of TEG 1 may be determined as 0.5 times the open circuit voltage 436 of the TEG1 operating at the first temperature differentials $\Delta T_1$. If the first temperature differentials $\Delta T_1$ changes, e.g. due to an ambient environment becoming hotter or colder or due to a change in ohmic heating of a power cable, the open circuit voltage 436 of TEG1 can be determined at a new temperature differential, $\Delta T_{new}$, and the MPP voltage of TEG1 can be determined as one-half of the open circuit voltage at the new temperature differential.

The I-V curve of some TEG devices may be non-linear. Further, the I-V curve of a particular TEG device may be shaped differently at different temperature differentials. In these circumstances, the MPP may not have a simple relationship to the open circuit voltage of the TEG device. To select the MPP voltage for such a TEG device, the MPP tracking device may use another MPP tracking algorithm to identify the MPP under a particular set of operating conditions (e.g., temperature differential). For example, a perturb-and-observe process may be used to track the MPP. The perturb-and-observe process may iteratively modify the operating current or voltage of the TEG device at a particular temperature differential and measure (or calculate) power output by the TEG device until a peak power at the particular temperature differential is observed. The peak power may be considered to be observed when a first small change results in an increase in the power output and a second small change results in a decrease in the power output. The MPP tracking device may perform the MPP tracking process continuously, occasionally (e.g., at determined intervals), or in response to a control input (e.g., a measured change in a temperature or in a temperature differential).

Figure 5:
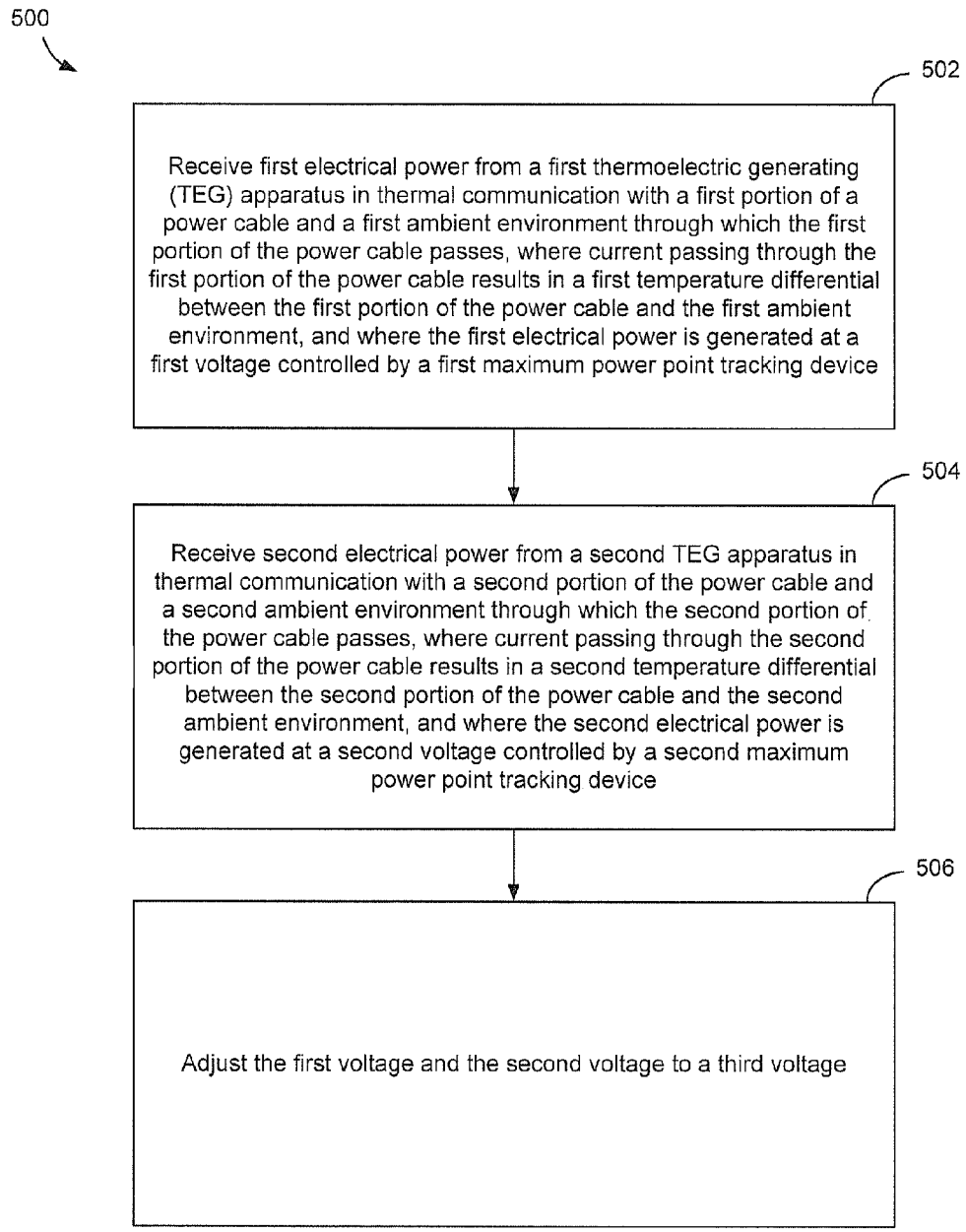
FIG. 5 is a flow diagram of a particular embodiment of a method of managing electrical power production from TEG devices.

FIG. 5 is a flow diagram of a particular embodiment of a method 500 of managing electrical power production from thermoelectric generating (TEG) devices. The method 500 may be performed by a system that generates electricity using TEG devices positioned proximate to a power cable, such as the system 100 of FIG. 1, the system 200 of FIG. 2, or the aircraft 300 of FIG. 3. A maximum power point tracking device may control one or more power conversion devices to operate one or more of the TEG devices to generate electricity at or near a maximum power point voltage of the TEG device, and electrical power received from each of the TEG devices may be converted to a common voltage, e.g., a common bus voltage.

The method 500 may include, at 502, receiving first electrical power from a first TEG device in thermal communication with a first portion of a power cable and a first ambient environment through which the first portion of the power cable passes. Current passing through the first portion of the power cable may result in a first temperature differential between the first portion of the power cable and the first ambient environment. The first electrical power is generated at a first voltage that may be controlled by a first maximum power point tracking device. For example, the first TEG device may include the first set 112 of TEG devices of FIG. 1, and electrical power output by the first set 112 of TEG devices may be received by the first power conversion device 130 of FIG. 1, which is controlled by the first maximum power point tracking device 132 of FIG. 1.

The method 500 may include, at 504, receiving second electrical power from a second TEG device in thermal communication with a second portion of the power cable and a second ambient environment through which the second portion of the power cable passes. Current passing through the second portion of the power cable may result in a second temperature differential between the second portion of the power cable and the second ambient environment. The second electrical power is generated at a second voltage that may be controlled by a second maximum power point tracking device. For example, the second TEG device may include the second set 122 of TEG devices of FIG. 1, electrical power output by the second set 122 of TEG devices may be received by the second power conversion device 140 of FIG. 1, which is controlled by the second maximum power point tracking device 142 of FIG. 1.

The first voltage may be different from the second voltage. For example, the first maximum power point tracking device may control the first voltage independently of the second maximum power point tracking device controlling the second voltage. Thus, the first maximum power point tracking device may set the first voltage to a different voltage level than the second maximum power point tracking device sets the second voltage to. In another example, the first temperature differential may be different from the second temperature differential. To illustrate, a first temperature of the first portion of the power cable may be different than a second temperature of the second portion of the power cable. Additionally or in the alternative, a first ambient temperature of the first ambient environment may be different from a second ambient temperature of the second ambient (and the first temperature of the first portion of the power cable may be different from or approximately equivalent to the second temperature of the second portion of the power cable). In still another example, the TEG devices may have different power output characteristics based on the different operating environments of the TEG devices, based on design of the TEG devices, or both. For example, the first TEG device may have a substantially linear voltage-current relationship and the second TEG device may have a substantially non-linear voltage-current relationship. In a further example, the maximum power point tracking devices may control the voltages differently depending on design and operation of the TEG devices. To illustrate, when the first TEG device has a substantially linear voltage-current relationship, the first maximum power point tracking device may control the first voltage to be equal to one-half of an open circuit voltage of the first TEG device. When the first TEG devices has a substantially non-linear voltage-current relationship, the first maximum power point tracking device may control the first voltage using a perturb-and-observe process or another MPP tracking process.

The method 500 may also include, at 506, adjusting the first voltage and the second voltage to a third voltage. For example, one or both of the first voltage and the second voltage may be adjusted to a common bus voltage using a power conversion device, such as the first power conversion device 130 or the second power conversion device 140 of FIG. 1.

Accordingly, TEG devices in different zones may output electricity at different voltage levels, which may be at or near an MPP voltage of the respective TEG device. Power converters coupled to the TEG devices convert the electricity to a common voltage before the electricity is provided to a common bus.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. An apparatus comprising:
    a first thermoelectric generating (TEG) device, wherein the first TEG device has a first surface configured to be positioned in thermal communication with an outer surface of a power cable and a second surface configured to be positioned proximate to a first ambient environment around a first portion of the power cable;
    a thermally-conductive jacket, wherein the first TEG device is enclosed within the thermally-conductive jacket, wherein the thermally-conductive jacket facilitates coupling of the first TEG device to the power cable, wherein the thermally-conductive jacket is configured to wrap around the outer surface of the power cable and form a gap between the outer surface of the power cable and an inner surface of the thermally-conductive jacket, wherein the outer surface of the power cable faces the inner surface of the thermally-conductive jacket, and wherein the thermally-conductive jacket is configured to position the first surface of the first TEG device to be in thermal communication with the outer surface of the power cable when the thermally-conductive jacket is wrapped around the outer surface of the power cable;
    a first set of terminals electrically coupled to the first TEG device, wherein, when a first temperature differential exists between the first surface and the second surface, the first TEG device converts heat into first electricity presented at the first set of terminals;
    a first power conversion device (PCD) coupled to the first set of terminals, the first PCD configured to provide a portion of the first electricity to a bus at a first voltage;
    a first maximum power point tracking (MPPT) device electrically coupled to a terminal of the first set of terminals and to a first sensing line electrically coupled to a terminal of the first set of terminals, wherein the first MPPT device is programmed to:
        measure a first control input signal using the first sensing line; and
        provide a control signal based on the first control input signal to the first PCD that causes the first PCD to set a value that determines a voltage of the first electricity;
    a second TEG device, wherein the second TEG device has a third surface configured to be positioned in thermal communication with the outer surface of the power cable and a fourth surface configured to be positioned proximate to a second ambient environment around a second portion of the power cable, and wherein the first ambient environment is different than the second ambient environment at operating conditions of the apparatus;
    a second set of terminals electrically coupled to the second TEG device, wherein, when a second temperature differential exists between the third surface and the fourth surface, the second TEG device converts heat into second electricity presented at the second set of terminals;
    a second PCD coupled to the second set of terminals, the second PCD configured to provide a portion of the second electricity to the bus at the first voltage; and
    a second MPPT device electrically coupled to a terminal of the second set of terminals and to a second sensing line electrically coupled to a terminal of the second set of terminals, wherein the second MPPT device is programmed to:
        measure a second control input signal using the second sensing line;
        select one of a linear current-voltage relationship and a non-linear current-voltage relationship to govern the second TEG device, wherein the selecting is based on a temperature difference between the first temperature differential and the second temperature differential; and
        provide a control signal to the second PCD based on the second control input signal and on the selected relationship, wherein the control signal causes the second PCD to set a value that determines a voltage of the second electricity based on the selected relationship.

2. The apparatus of claim 1, wherein the first surface of the first TEG device is shaped to substantially conform to the outer surface of the power cable while maintaining the gap between the outer surface of the power cable and the inner surface of the thermally-conductive jacket.

3. The apparatus of claim 1, further comprising a fastener that secures the thermally-conductive jacket to the outer surface of the power cable.

4. The apparatus of claim 1, further comprising a second thermally-conductive jacket enclosing the second TEG device, wherein the second thermally-conductive jacket facilitates coupling of the second TEG device to the power cable, and wherein the second thermally-conductive jacket is configured to wrap around the outer surface of the power cable.

5. The apparatus of claim 1, further comprising one or more heat sink projections that extend away from the power cable.

6. The apparatus of claim 1, wherein each of the TEG devices includes at least one positive-type doped-to-negative-type doped (P-N) thermoelectric pellet pair.

7. An aircraft system comprising:
an airframe that includes one or more structures and two or more zones, wherein the two or more zones include a first zone having a first ambient environment and a second zone having a second ambient environment, wherein the first zone and the second zone are divided by at least one of the one or more structures, and wherein the first ambient environment is different than the second ambient environment;
a power feeder cable configured to convey electrical power generated by an electrical power generating system through the two or more zones including the first zone and the second zone, wherein the power feeder cable is exposed to at least the first ambient environment and the second ambient environment; and
wherein the first zone includes:
a first thermoelectric generating (TEG) device positioned along an outer surface of the power feeder cable in the first zone, wherein the first TEG device is configured to generate electrical power based on a first temperature differential between the power feeder cable and a first ambient temperature of the first ambient environment in the first zone;
a thermally-conductive jacket, wherein the first TEG device is enclosed within the thermally-conductive jacket, wherein the thermally-conductive jacket facilitates coupling of the first TEG to the power feeder cable, wherein the thermally-conductive jacket is deformable to substantially conform to the outer surface of the power feeder cable by wrapping around the outer surface of the power feeder cable, wherein the thermally-conductive jacket is configured to position a first surface of the first TEG device to be in thermal communication with the outer surface of the power feeder cable when the thermally-conductive jacket is wrapped around the outer surface of the power feeder cable;
a first maximum power point tracking (MPPT) device that controls a first operating voltage of the first TEG device to be near or at a first maximum power point voltage of the first TEG device at the first temperature differential; and
a first power conversion device that converts the first operating voltage to a third voltage of a bus that extends through at least the first zone and the second zone; and
wherein the second zone includes:
a second TEG device positioned along the surface of the power feeder cable in the second zone, wherein the second TEG device is configured to generate electrical power based on a second temperature differential between the power feeder cable and a second ambient temperature of the second ambient environment in the second zone, and wherein the first ambient temperature is different than the second ambient temperature at operating conditions of the aircraft system;
a second MPPT device electrically coupled to a sensing line that is electrically coupled to the bus, wherein the second MPPT device is programmed to:
select one of a linear current-voltage relationship and a non-linear current-voltage relationship to govern the second TEG device based on the relationship, wherein the selecting is based on a temperature difference between the first ambient temperature and the second ambient temperature; and
control a second operating voltage of the second TEG device to be near or at a second maximum power point voltage of the second TEG device at the second temperature differential based on the selected relationship; and
a second power conversion device that converts the second operating voltage to the third voltage of the bus.

8. The aircraft system of claim 7, wherein the first maximum power point tracking device is coupled to a single terminal of a first set of terminals.

9. The aircraft system of claim 7, wherein the thermally-conductive jacket is in thermal communication with a first surface of the first TEG device.

10. The aircraft system of claim 9, wherein the thermally-conductive jacket is in thermal communication with a second surface of the first TEG device.

11. The aircraft system of claim 10, wherein an outer jacket surface of the thermally-conductive jacket is in thermal communication with the second surface of the first TEG device.

12. The aircraft system of claim 11, wherein the outer jacket surface is in thermal communication with a plurality of heat sink projections.

13. The aircraft system of claim 7, wherein a first surface is configured to be a hot side for the first TEG device, and wherein a second surface is configured to be a cold side for the first TEG device.

14. The apparatus of claim 1, wherein the thermally-conductive jacket is in thermal communication with the first surface of the first TEG device.

15. The apparatus of claim 14, wherein the thermally-conductive jacket is in thermal communication with the second surface of the first TEG device.

16. The apparatus of claim 1, wherein an outer jacket surface of the thermally-conductive jacket is in thermal communication with the second surface of the first TEG device.

17. The apparatus of claim 16, wherein the outer jacket surface is in thermal communication with a plurality of heat sink projections.

18. The apparatus of claim 1, wherein the first surface of the first TEG device is curved and configured to substantially conform to the outer surface of the power cable while maintaining the gap between the outer surface of the power cable and the inner surface of the thermally-conductive jacket.

19. The apparatus of claim 1,
wherein the second MPPT device is further programmed to provide the control signal to the second PCD based on a measured change in the first temperature differential or in the second temperature differential, and
wherein providing the control signal includes iteratively adjusting the control signal to determine the voltage of the second electricity at a maximum of the current-voltage relationship governing the second TEG device at the second temperature differential.

* * * * *